(12) United States Patent
Huang et al.

(10) Patent No.: US 10,170,429 B2
(45) Date of Patent: Jan. 1, 2019

(54) METHOD FOR FORMING PACKAGE STRUCTURE INCLUDING INTERMETALLIC COMPOUND

(71) Applicant: Taiwan Semiconductor Manufacturing Co., Ltd., Hsinchu (TW)

(72) Inventors: Heng-Chi Huang, Zhudong Township, Hsinchu County (TW); Chien-Chen Li, Hsinchu (TW); Kuo-Lung Li, Taoyuan (TW); Cheng-Liang Cho, Taipei (TW); Che-Jung Chu, Hsinchu (TW); Kuo-Chio Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/431,802

(22) Filed: Feb. 14, 2017

(65) Prior Publication Data

US 2018/0151537 A1    May 31, 2018

Related U.S. Application Data

(60) Provisional application No. 62/426,968, filed on Nov. 28, 2016.

(51) Int. Cl.
*H01L 25/065* (2006.01)
*H01L 25/00* (2006.01)
(Continued)

(52) U.S. Cl.
CPC ...... *H01L 23/5389* (2013.01); *H01L 21/6835* (2013.01); *H01L 2221/68331* (2013.01);
(Continued)

(58) Field of Classification Search
CPC . H01L 25/0652; H01L 21/56; H01L 23/3121; H01L 23/5389; H01L 24/19; H01L 24/20; H01L 25/0657; H01L 25/50; H01L 2225/06517; H01L 2225/06541; H01L 21/6835; H01L 2221/68331; H01L 2221/68381; H01L 2224/0401; H01L 2224/73204; H01L 2224/81193; H01L 2224/92125; H01L 2924/15311
(Continued)

(56) References Cited

U.S. PATENT DOCUMENTS 7,564,115 B2    7/2009  Chen et al.
7,633,165 B2   12/2009  Hsu et al.
(Continued)

*Primary Examiner* — Didarul Mazumder
(74) *Attorney, Agent, or Firm* — McClure, Qualey & Rodack, LLP

(57) ABSTRACT

Package structures and methods for forming the same are provided. A package structure includes a package component including a first bump. The package structure also includes an intermetallic compound (IMC) on the first bump. The package structure further includes an integrated circuit die including a second bump on the IMC. The integrated circuit die and the package component are bonded together through the first bump and the second bump. The IMC extends from the first bump to the second bump to provide good physical and electrical connections between the first bump and the second bump.

20 Claims, 14 Drawing Sheets

(51) Int. Cl.
  *H01L 21/56* (2006.01)
  *H01L 23/31* (2006.01)
  *H01L 23/538* (2006.01)
  *H01L 23/00* (2006.01)
  *H01L 21/68* (2006.01)
  *H01L 21/683* (2006.01)
(52) U.S. Cl.
  CPC ........... *H01L 2221/68381* (2013.01); *H01L 2224/0401* (2013.01); *H01L 2224/73204* (2013.01); *H01L 2224/81193* (2013.01); *H01L 2224/92125* (2013.01); *H01L 2924/15311* (2013.01)
(58) Field of Classification Search
  USPC .......................................... 257/686; 438/109
  See application file for complete search history.

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2001/0027007 A1* | 10/2001 | Hosomi ............... H01L 24/11 438/611 |
| 2010/0247955 A1* | 9/2010 | Takahashi ........... B23K 1/0016 428/647 |
| 2012/0211885 A1* | 8/2012 | Choi .................. H01L 23/3128 257/737 |
| 2013/0168851 A1* | 7/2013 | Lin ...................... H01L 24/11 257/737 |
| 2013/0193593 A1* | 8/2013 | Lin ...................... H01L 24/13 257/737 |
| 2013/0241069 A1* | 9/2013 | Nakamura ........... B23K 1/0016 257/762 |
| 2014/0001645 A1 | 1/2014 | Lin et al. |
| 2014/0124920 A1* | 5/2014 | Chuang ................ H01L 24/11 257/737 |
| 2014/0225258 A1 | 8/2014 | Chiu et al. |
| 2014/0252572 A1 | 9/2014 | Hou et al. |
| 2015/0061118 A1* | 3/2015 | Chen .................... H01L 24/16 257/737 |
| 2015/0184446 A1* | 7/2015 | Veerasamy ........... E06B 3/6775 428/34 |
| 2015/0287697 A1 | 10/2015 | Tsai et al. |
| 2015/0348872 A1 | 12/2015 | Kuo et al. |

\* cited by examiner

METHOD FOR FORMING PACKAGE STRUCTURE INCLUDING INTERMETALLIC COMPOUND

CROSS REFERENCE TO RELATED APPLICATIONS

This Application claims the benefit of U.S. Provisional Application No. 62/426,968, filed on Nov. 28, 2016, and entitled "Package structure and method for forming the same", the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes a smaller area or a lower height, in some applications.

New packaging technologies have been developed to improve the density and functionality of semiconductor dies further. For example, three-dimensional integrated circuit (3DIC) packages have been developed. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
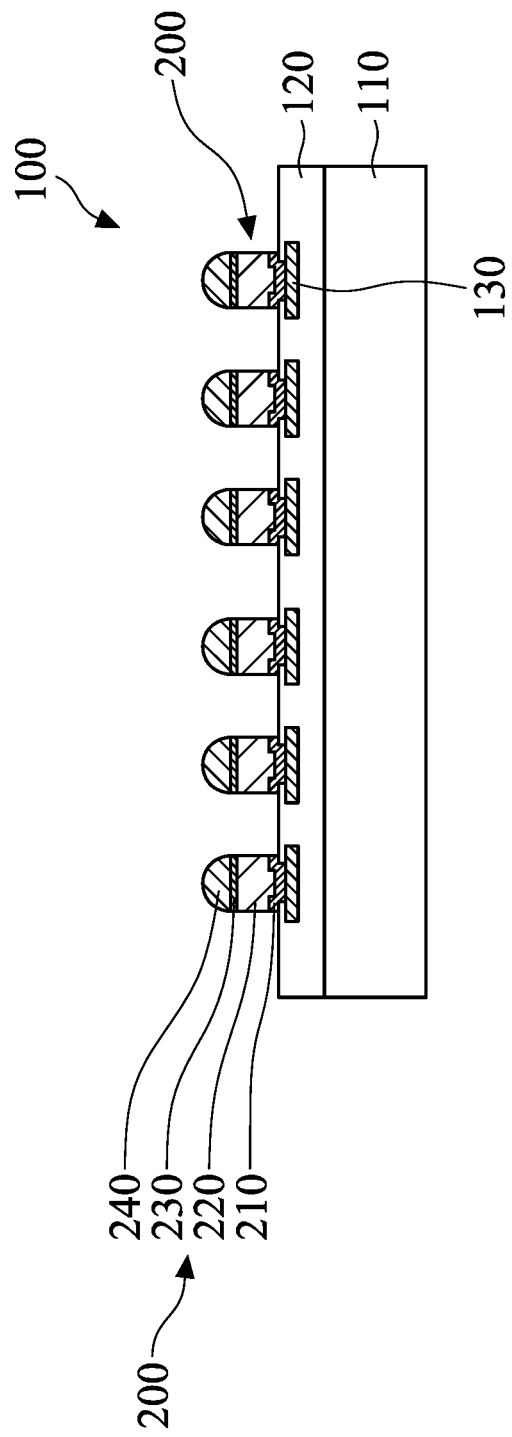
FIGS. 1A-1K are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments for a package structure and methods for forming the same are described. The package structure may be a chip-on-wafer-on-substrate (CoWoS) package or another suitable package.

FIGS. 1A-1K are cross-sectional views of various stages of a process for forming a package structure, in accordance with some embodiments. Although some embodiments are discussed with operations performed in a particular order, these operations may be performed in another logical order. Additional operations can be provided before, during, and/or after the stages described in FIGS. 1A-1K. Some of the stages that are described can be replaced or eliminated for different embodiments. Additional features can be added to the package structure. Some of the features described below can be replaced or eliminated for different embodiments.

As shown in FIG. 1A, an integrated circuit die (chip) 100 is provided, in accordance with some embodiments. The integrated circuit die 100 is sawed from a wafer, and may be a "known-good-die". In some embodiments, the integrated circuit die 100 is a logic die, a memory die, or another applicable type of die. In some embodiments, the integrated circuit die 100 includes a semiconductor substrate 110, a passivation layer 120, conductive features 130, and connectors 200.

In some embodiments, the semiconductor substrate 110 includes silicon or another elementary semiconductor material such as germanium. In some other embodiments, the semiconductor substrate 110 includes a compound semiconductor. The compound semiconductor may include gallium arsenide, silicon carbide, indium arsenide, indium phosphide, another suitable compound semiconductor, or a combination thereof. In some embodiments, the semiconductor substrate 110 includes a semiconductor-on-insulator (SOI) substrate.

Various active elements (not shown) are formed in and/or over the semiconductor substrate 110, in accordance with some embodiments. Examples of the various active elements include transistors, diodes, another suitable active element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various passive elements (not shown) may also be formed in and/or over the semiconductor substrate 110.

Examples of the various passive elements include capacitors, inductors, resistors, another suitable passive element, or a combination thereof.

An interconnection structure is positioned over the semiconductor substrate 110. The interconnection structure may include multiple dielectric and passivation layers and multiple conductive features. The dielectric and passivation layers cover the active and/or passive elements over the semiconductor substrate 110. The dielectric and passivation layers may be an interlayer dielectric (ILD) layer, intermetal dielectric (IMD) layers, and one or more passivation layers. The conductive features are positioned in the dielectric layers, covered by the passivation layers, and electrically connected to the elements in and/or over the semiconductor substrate 110. The conductive features may be conductive contacts, conductive lines, conductive vias and/or conductive pads.

For example, the interconnection structure includes the passivation layer 120 and the conductive features 130 in the passivation layer 120, as shown in FIG. 1A. The passivation layer 120 may be a multi-layer structure. The conductive features 130 are partially exposed by the passivation layer 120. The conductive features 130 may be conductive pads or conductive lines. Alternatively, the conductive features 130 may be a post-passivation interconnect (PPI) layer.

As shown in FIG. 1A, multiple connectors 200 are positioned over the conductive features 130, in accordance with some embodiments. The connectors 200 are electrically connected to the conductive features 130. The connectors 200 may be referred to as micro-bumps. In some embodiments, each of the connectors 200 includes an under bump metallization (UBM) layer 210, a conductive bump 220, a conductive cap layer 230, and a solder layer 240. Some features of the connectors 200 can be replaced or eliminated for different embodiments.

In some embodiments, the UBM layer 210 of the connectors 200 is in electrical contact with the conductive features 130. The UBM layer 210 may be made of titanium, titanium nitride, tantalum, tantalum nitride, tungsten, titanium tungsten, nickel, gold, chrome, copper, copper alloy, another suitable material, or a combination thereof. Although FIG. 1A shows that the UBM layer 210 is a single layer, the UBM layer 210 may be a multi-layer structure. In some embodiments, the UBM layer 210 includes a diffusion barrier layer (or an adhesion layer) over the conductive features 130 and a seed layer over the diffusion barrier layer. For example, the diffusion barrier layer may be made of titanium or titanium nitride, and the seed layer may be made of copper or a copper alloy.

In some embodiments, the conductive bump 220 is positioned over the UBM layer 210. The conductive bump 220 may be referred to as a conductive pillar. In some embodiments, the conductive bump 220 is made of copper, a copper alloy, or another suitable material. The copper alloy may contain tantalum, indium, tin, manganese, chromium, titanium, germanium, platinum, magnesium, another suitable material, or a combination thereof.

In some embodiments, the conductive cap layer 230 is positioned over the conductive bump 220. In some embodiments, the conductive cap layer 230 is made of nickel, tin, tin-lead (SnPb), gold, silver, palladium, indium, nickel-palladium-gold (NiPdAu), nickel-gold (NiAu), another suitable material, or a combination thereof.

In some embodiments, the solder layer 240 is positioned over the conductive cap layer 230. In some embodiments, the solder layer 240 is made of Sn, SnAg, SnPb, SnAgCu, SnAgZn, SnZn, SnBiIn, SnIn, SnAu, SnPb, SnCu, SnZnIn, or SnAgSb, another suitable material, or a combination thereof.

Many variations and/or modifications can be made to embodiments of the disclosure. In some other embodiments, the connectors 200 further include a conductive insertion layer between the solder layer 240 and the conductive cap layer 230. The conductive insertion layer may be made of copper, a copper alloy, or another suitable material. The copper alloy may contain tantalum, indium, tin, manganese, chromium, titanium, germanium, platinum, magnesium, another suitable material, or a combination thereof.

Figure 1B:
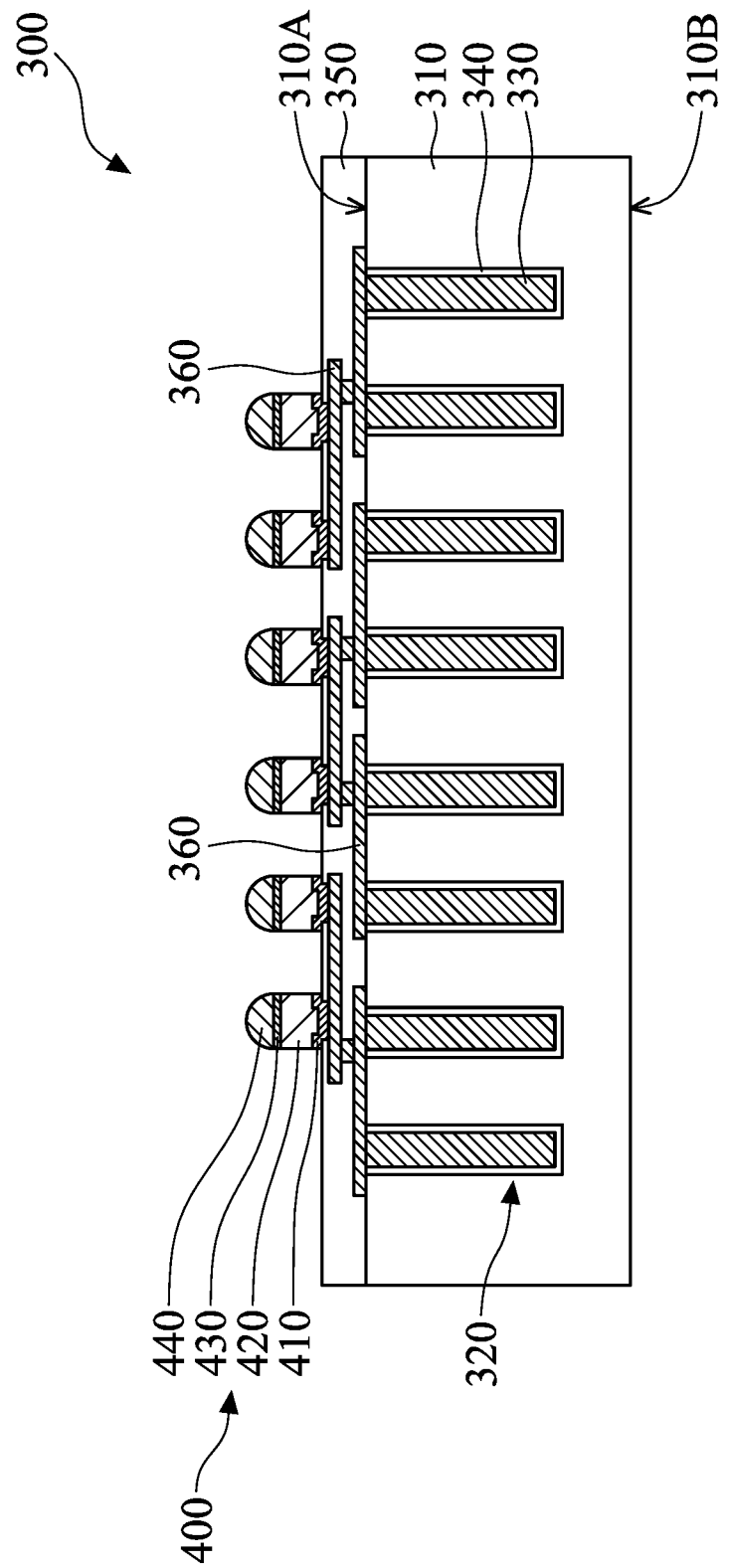

As shown in FIG. 1B, a package component 300 is provided, in accordance with some embodiments. In some embodiments, the package component 300 is an interposer or another suitable component. The interposer may be substantially free of active elements, such as transistors, diodes, or other active elements. The interposer may include, or may be substantially free of passive elements, such as capacitors, resistors, inductors, or other passive elements. In some embodiments, the package component 300 includes a substrate 310, conductive features 330, an insulating layer 340, a passivation layer 350, conductive layers 360, and connectors 400.

In some embodiments, the substrate 310 is a wafer. In some embodiments, the substrate 310 includes a semiconductor material or another suitable material. The semiconductor material may be silicon, another elementary semiconductor material, or a compound semiconductor.

In some embodiments, the conductive features 330 are embedded in the substrate 310. In some embodiments, the conductive features 330 extend from the top surface 310A of the substrate 310 towards the bottom surface 310B of the substrate 310. In some embodiments, the insulating layer 340 is embedded in the substrate 310 and surrounds the conductive features 330. The insulating layer 340 separates the conductive features 330 from the substrate 310.

In some embodiments, the passivation layer 350 is positioned over the top surface 310A of the substrate 310. The passivation layer 350 may be a multi-layer structure. In some embodiments, the conductive layers 360 are positioned in the passivation layer 350. The bottommost of the conductive layers 360 is in electrical contact with the conductive features 330. The topmost of the conductive layers 360 is partially exposed by the passivation layer 350. The conductive layers 360 may be referred to as redistribution layers (RDLs).

As shown in FIG. 1B, multiple connectors 400 are formed over the substrate 310, in accordance with some embodiments. The connectors 400 are positioned over the passivation layer 350. The connectors 400 are electrically connected to the conductive features 330 through the conductive layers 360. However, embodiments of the disclosure are not limited thereto. The package component 300 may not include the passivation layer 350 and the conductive layers 360. In some other embodiments, the connectors 400 are in electrical contact with the conductive features 330.

The connectors 400 may be referred to as micro-bumps. In some embodiments, each of the connectors 400 includes an UBM layer 410, a conductive bump 420, a conductive cap layer 430, and a solder layer 440. Some features of the connectors 400 can be replaced or eliminated for different embodiments.

In some embodiments, the UBM layer 410 of the connectors 400 is in electrical contact with the topmost of the conductive layers 360 or the conductive features 330. The UBM layer 410 may be made of titanium, titanium nitride, tantalum, tantalum nitride, tungsten, titanium tungsten, nickel, gold, chrome, copper, copper alloy, another suitable material, or a combination thereof. Although FIG. 1B shows that the UBM layer 410 is a single layer, the UBM layer 410 may be a multi-layer structure. In some embodiments, the UBM layer 410 includes a diffusion barrier layer (or an adhesion layer) and a seed layer over the diffusion barrier layer. For example, the diffusion barrier layer may be made of titanium or titanium nitride, and the seed layer may be made of copper or a copper alloy.

In some embodiments, the conductive bump 420 is positioned over the UBM layer 410. The conductive bump 420 may be referred to as a conductive pillar. In some embodiments, the conductive bump 420 is made of copper, a copper alloy, or another suitable material. The copper alloy may contain tantalum, indium, tin, manganese, chromium, titanium, germanium, platinum, magnesium, another suitable material, or a combination thereof.

In some embodiments, the conductive cap layer 430 is positioned over the conductive bump 420. In some embodiments, the conductive cap layer 230 is made of nickel, tin, SnPb, gold, silver, palladium, indium, NiPdAu, NiAu, another suitable material, or a combination thereof.

In some embodiments, the solder layer 440 is positioned over the conductive cap layer 430 so that of the conductive cap layer 430 is between the solder layer 440 and the conductive bump 420. In some embodiments, the solder layer 440 is made of Sn, SnAg, SnPb, SnAgCu, SnAgZn, SnZn, SnBiIn, SnIn, SnAu, SnPb, SnCu, SnZnIn, or SnAgSb, another suitable material, or a combination thereof.

Many variations and/or modifications can be made to embodiments of the disclosure. In some other embodiments, the connectors 400 further include a conductive insertion layer between the solder layer 440 and the conductive cap layer 430.

Figure 1C:
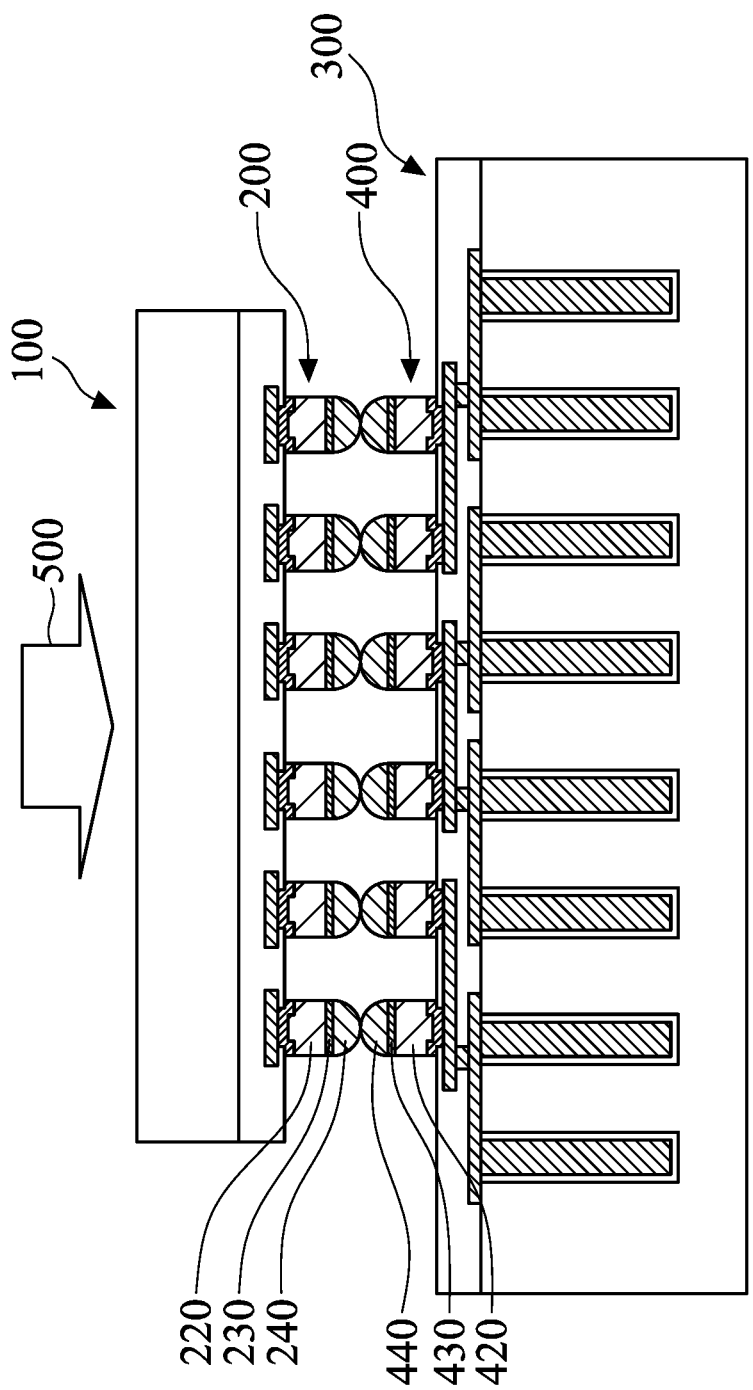

As shown in FIG. 1C, the integrated circuit die 100 is turned upside down and placed over the package component 300, in accordance with some embodiments. The connectors 200 of the integrated circuit die 100 are substantially aligned to the connectors 400 of the integrated circuit die 100. In some embodiments, the solder layer 240 of the connectors 200 adjoins the solder layer 440 of the connectors 400. The structure and/or material of the connectors 400 may or may not be substantially the same as that of the connectors 200. The connectors 400 and the connectors 200 may or may not be the same size.

Afterwards, a reflow process 500 is performed to bond the integrated circuit die 100 and the package component 300 together, as shown in FIG. 1C in accordance with some embodiments. In some embodiments, the reflow process 500 is performed at a melting point temperature of the solder layer 240 and/or the solder layer 440. In some embodiments, the reflow process 500 is performed at a temperature in a range from about 150 degrees C. to about 300 degrees C. However, embodiments of the disclosure are not limited thereto.

Figure 1D:
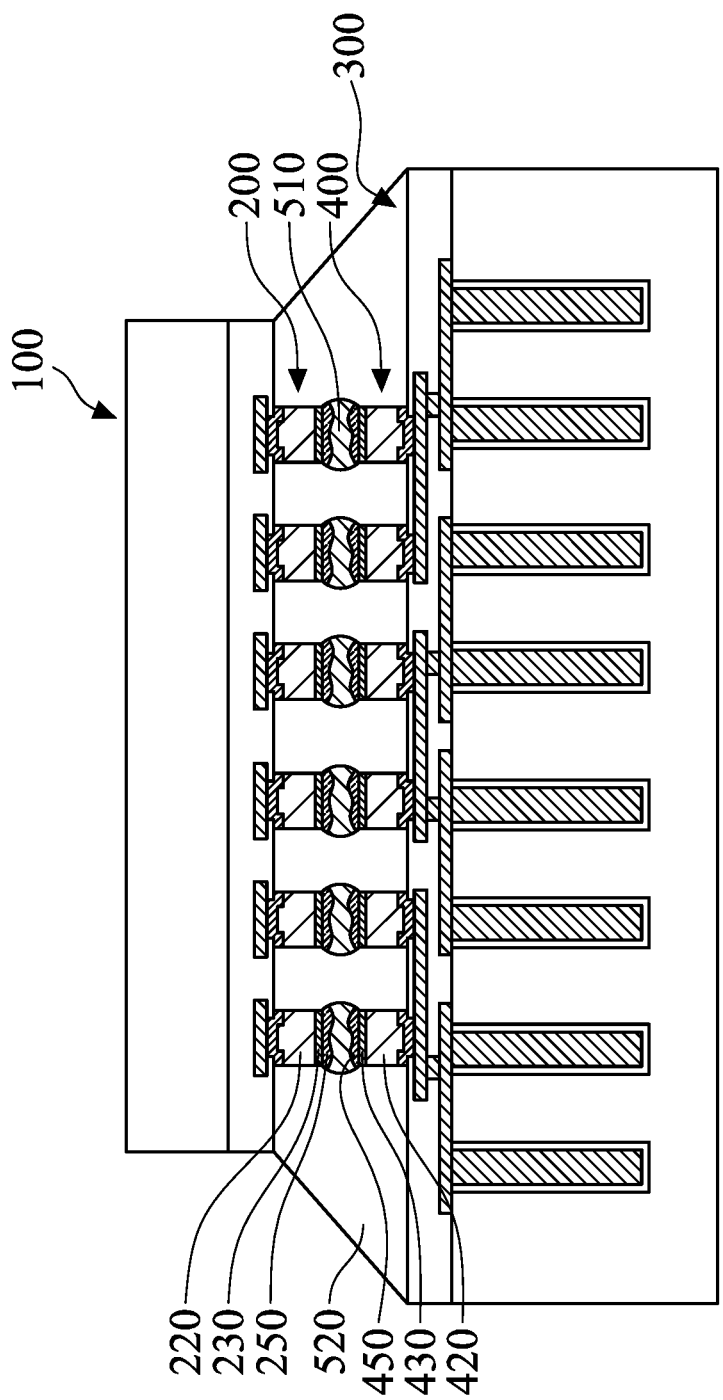

During the reflow process 500, the solder layer 240 and the solder layer 440 are melted and reshaped to together form a solder joint 510, which is shown in FIG. 1D. As a result, the integrated circuit die 100 and the package component 300 are bonded together through the solder joint 510.

During the reflow process 500, the materials of the connectors 200 may migrate. In some embodiments, the material (such as Sn) of the solder layer 240 and the material (such as Cu) of the conductive bump 220 migrate and react with each other. As a result, an intermetallic compound (IMC) 250 is formed between the solder joint 510 and the connectors 200, as shown in FIG. 1D. The IMC 250 may be referred to as an intermetallic alloy, ordered intermetallic alloy, or a long-range-ordered alloy. An IMC is a solid-state compound containing two or more metallic elements, and exhibits metallic bonding and ordered crystal structure. The IMC may be a substance formed when solder comes in contact with another metal at an elevated temperature. As a result, the IMC includes materials from solder and the other metal. The IMC has unique mechanical and electrical properties, which are different from those of the solder and the other metal.

In some embodiments, the IMC 250 is between the solder joint 510 and the conductive cap layer 230. In some embodiments, the IMC 250 includes $Cu_6Sn_5$. In some other embodiments, the IMC 250 includes $Ni_3Sn_4$, $AuSn_4$ or another suitable material.

During the reflow process 500, the materials of the connectors 400 may migrate. In some embodiments, the material (such as Sn) of the solder layer 440 and the material (such as Cu) of the conductive bump 420 migrate and react with each other. As a result, an IMC 450 is formed between the solder joint 510 and the connectors 400, as shown in FIG. 1D. In some embodiments, the IMC 450 is between the solder joint 510 and the conductive cap layer 430. In some embodiments, the IMC 250 and the IMC 450 are separated from each other by the solder joint 510. In some embodiments, the IMC 450 includes $Cu_6Sn_5$. In some other embodiments, the IMC 450 includes $Ni_3Sn_4$, $AuSn_4$ or another suitable material. The IMC 450 and the IMC 250 may or may not be made of the same material.

The interface between the IMC 450 and the solder joint 510 or between the IMC 250 and the solder joint 510 may be irregular. In some embodiments, the interface between the IMC 450 and the solder joint 510 or between the IMC 250 and the solder joint 510 can be observed using an electron microscope, such as a scanning electron microscope (SEM), and/or spectroscopy technology, such as an energy-dispersive X-ray spectroscopy (EDS, EDX, or XEDS).

As shown in FIG. 1D, an underfill layer 520 is deposited between the integrated circuit die 100 and the package component 300, in accordance with some embodiments. As a result, the connectors 200, the IMC 250, the solder joint 510, the IMC 450 and the connectors 400 are embedded in and protected by the underfill layer 520. In some embodiments, the underfill layer 520 surrounds and adjoins the connectors 200, the IMC 250, the solder joint 510, the IMC 450 and the connectors 400.

In some embodiments, the underfill layer 520 includes liquid epoxy, deformable gel, silicon rubber, another suitable material, or a combination thereof. In some embodiments, the underfill layer 520 includes an epoxy-based resin with fillers dispersed therein. The fillers may include insulating fibers, insulating particles, other suitable elements, or a combination thereof. In some embodiments, a dispensing process is performed to form the underfill layer 520.

Figure 1E:
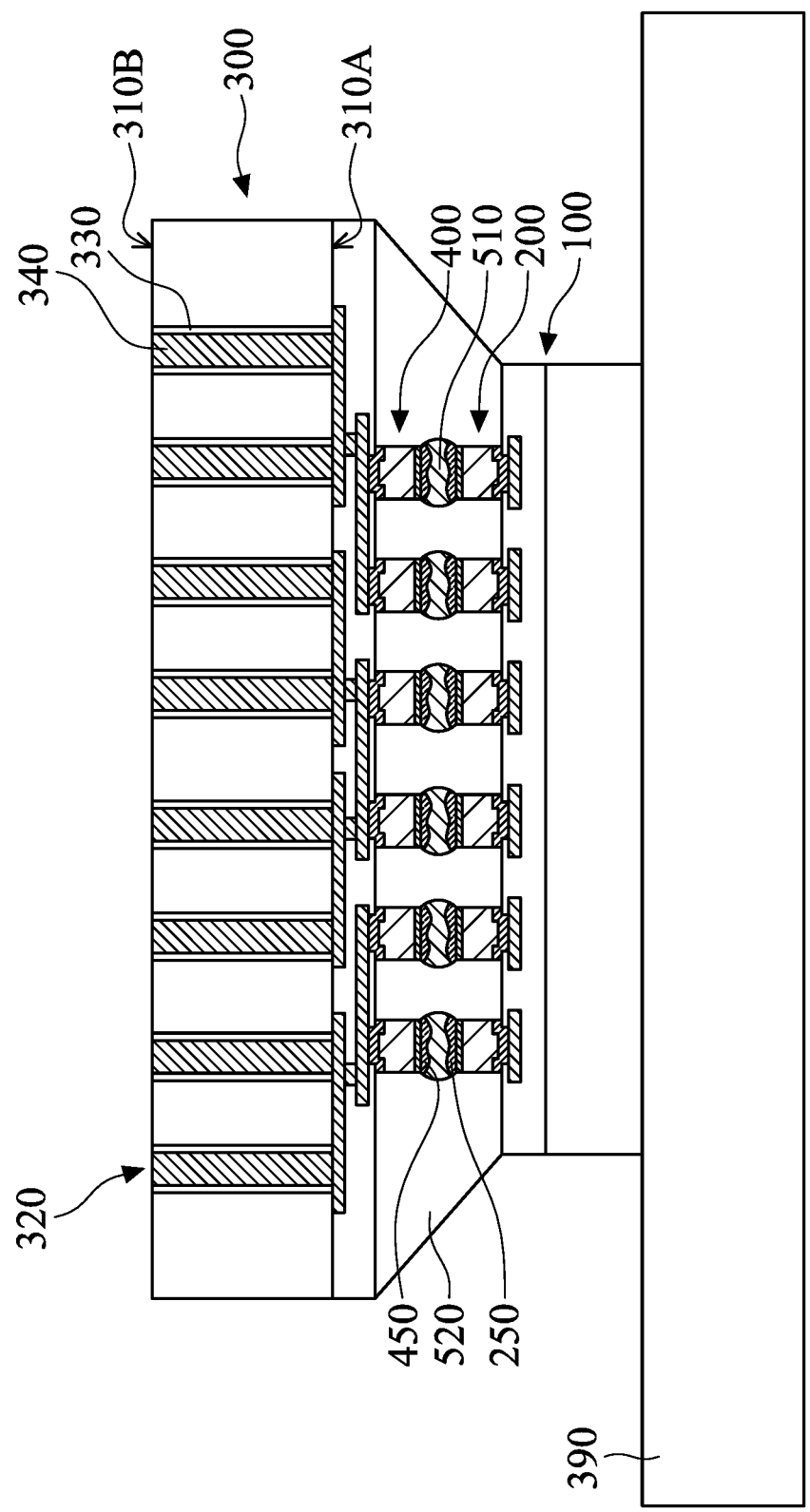

As shown in FIG. 1E, the package component 300 and the integrated circuit die 100, which are bonded together, are turned upside down and placed over a carrier substrate 390, in accordance with some embodiments. In some embodiments, the carrier substrate 390 is used as a temporary substrate. The temporary substrate provides mechanical and structural support during subsequent processing steps, such as those described in more detail later. The carrier substrate 390 is made of a semiconductor material, ceramic material, polymer material, metal material, another suitable material, or a combination thereof. In some embodiments, the carrier substrate 390 is a glass substrate. In some other embodiments, the carrier substrate 390 is a semiconductor substrate, such as a silicon wafer.

In some embodiments, the integrated circuit die 100 is attached to the carrier substrate 390 through an adhesive layer (not shown). The adhesive layer is used as a temporary adhesive layer. The adhesive layer may be glue or a tape. In some embodiments, the adhesive layer is photosensitive and is easily detached from the carrier substrate 390 by light irradiation. For example, shining ultra-violet (UV) light or laser light on the carrier substrate 390 is used to detach the adhesive layer. In some embodiments, the adhesive layer is a light-to-heat-conversion (LTHC) coating. In some other embodiments, the adhesive layer is heat-sensitive and is easily detached from the carrier substrate 390 when it is exposed to heat.

Afterwards, the substrate 310 of the package component 300 is thinned using the carrier substrate 390 as support, as shown in FIG. 1E in accordance with some embodiments. In some embodiments, the substrate 310 is thinned from the bottom surface 310B until the conductive features 330 are exposed. The conductive features 330 and the insulating layer 340 in the substrate 310 may be partially removed. In some embodiments, the conductive features 330 and the insulating layer 340 become exposed and penetrate through the thinned substrate 310. As a result, through-substrate vias (TSVs) 320 are formed in the substrate 310. The TSVs 320 may be referred to as through-silicon vias.

In some embodiments, the substrate 310 is thinned using a planarization process. The planarization process may include a chemical mechanical polishing (CMP) process, a grinding process, an etching process, another applicable process, or a combination thereof.

Figure 1F:
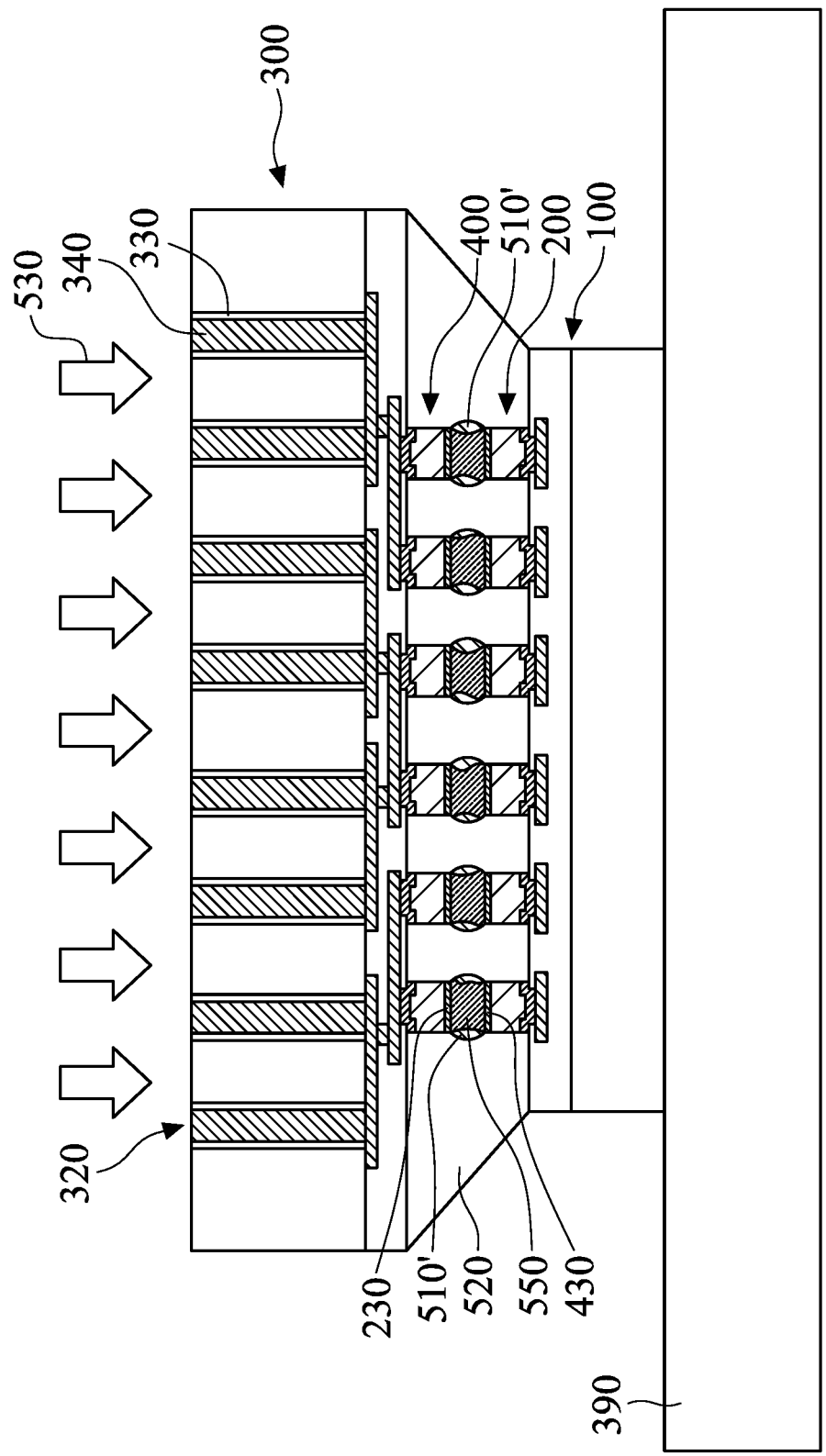

As shown in FIG. 1F, a thermal annealing treatment 530 is performed over the integrated circuit die 100 and the package component 300, in accordance with some embodiments. During the thermal annealing treatment 530, the materials of the connectors 200, the connectors 400, and the solder joint 510 may migrate. In some embodiments, the material (such as Sn) of the solder joint 510 and the material (such as Cu) of the conductive bump 220 migrate and react with each other. More intermetallic compounds are grown. As a result, the IMC 250 is expanded while the solder joint 510 is shrunk. In some embodiments, the material (such as Sn) of the solder joint 510 and the material (such as Cu) of the conductive bump 420 migrate and react with each other. More intermetallic compounds are grown. As a result, the IMC 450 is enlarged while the solder joint 510 becomes smaller.

In some embodiments, the IMC 250 and the IMC 450 are thickened and broadened until the IMC 250 and the IMC 450 are sufficiently connected to each other. As a result, a continuous IMC 550 is formed between one of the connectors 200 and one of the connectors 400 during the thermal annealing treatment 530, as shown in FIG. 1F. In some embodiments, the IMC 550 includes $Cu_6Sn_5$, $Ni_3Sn_4$, $AuSn_4$ or another suitable material. In some embodiments, the solder joint 510 is separated from the connectors 200 and the connectors 400 by the IMC 550.

In some embodiments, the IMC 550 continuously extends from one of the connectors 200 to one of the connectors 400. Space surrounded by the underfill layer 520, one of the connectors 200 and one of the connectors 400 is substantially filled up with the IMC 550. In other words, the thickness of the IMC 550 is substantially equal to the distance between one of the connectors 200 and one of the connectors 400. In some embodiments, the thickness of the IMC 550 is greater than that of the conductive cap layer 230. In some embodiments, the thickness of the IMC 550 is greater than that of the conductive cap layer 430. In some embodiments, the IMC 550 is in direct contact with the conductive cap layer 230 and the conductive cap layer 430. In some embodiments, the IMC 550 is in direct contact with the underfill layer 520.

In some embodiments, the solder joint 510 sandwiched between the IMC 250 and the IMC 450 is reacted and consumed during the thermal annealing treatment 530. In some embodiments, the solder joint 510 has a remaining solder portion 510' surrounding the IMC 550. In some embodiments, the solder joint 510 has multiple disconnected remaining solder portions 510' adjoining the IMC 550. However, embodiments of the disclosure are not limited thereto. In some other embodiments, the solder joint 510 is substantially eliminated after the thermal annealing treatment 530.

In some embodiments, the IMC 550 gradually becomes wider from its center towards the connectors 200. In some embodiments, the IMC 550 gradually becomes wider from its center towards the connectors 400. In some embodiments, the IMC 550 separates the conductive cap layer 230 and the conductive cap layer 430 from the solder portion 510'.

In some embodiments, the interface between the IMC 550 and the solder portion 510' extends along a direction from the connectors 200 towards the connectors 400. The interface between the IMC 550 and the solder portion 510' may be irregular. In some embodiments, the interface between the IMC 550 and the solder portion 510' can be observed using a SEM and/or an EDS.

The thermal annealing treatment 530 may be referred to as a reflow process. In some embodiments, the thermal annealing treatment 530 is performed at a melting point temperature of the solder layer 240 and/or the solder layer 440. In some embodiments, the thermal annealing treatment 530 is performed at a temperature in a range from about 150 degrees C. to about 300 degrees C. However, embodiments of the disclosure are not limited thereto. The operation temperature and/or time of the thermal annealing treatment 530 may or may not be substantially the same as that of the reflow process 500.

Figure 1G:
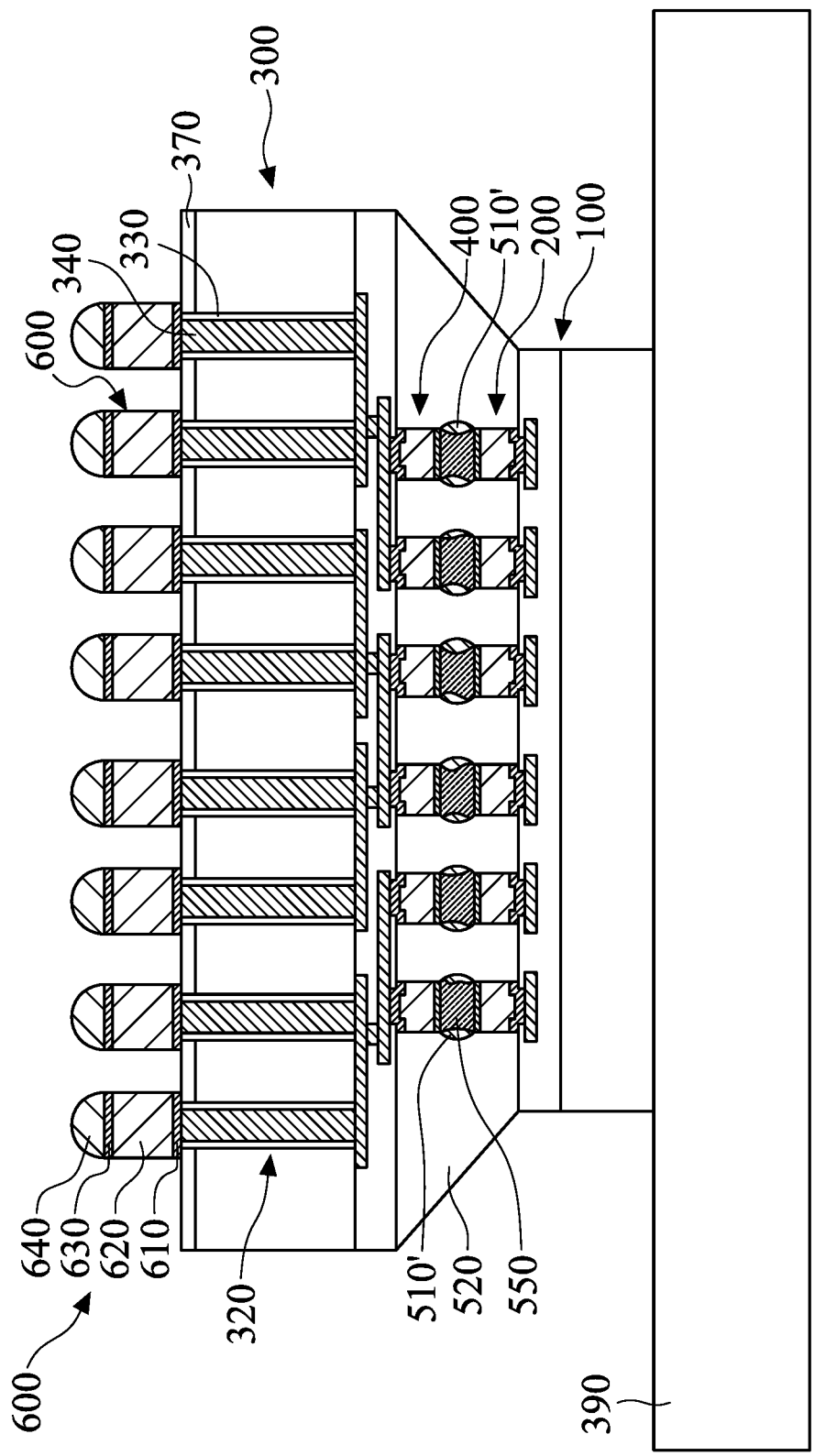

As shown in FIG. 1G, the substrate 310 of the package component 300 is further thinned from the bottom surface 310B, in accordance with some embodiments. As a result, the TSVs 320 protrude from the substrate 310. In some embodiments, the substrate 310 is thinned using an etching process or another applicable process.

Afterwards, a protective layer 370 is deposited over the substrate 310, as shown in FIG. 1G in accordance with some embodiments. The protective layer 370 surrounds protruding portions of the TSVs 320. In some embodiments, the protective layer 370 is made of silicon oxide, silicon nitride, another suitable material, or a combination thereof. In some embodiments, the protective layer 370 is deposited using a spin-on process, a chemical vapor deposition (CVD) process, another applicable process, or a combination thereof. In some embodiments, the deposited protective layer 370 covers the TSVs 320. Afterwards, a planarization process is performed over the deposited protective layer 370 to expose the TSVs 320. The planarization process may include a CMP process, a grinding process, an etching process, another applicable process, or a combination thereof.

As shown in FIG. 1G, multiple connectors 600 are positioned over the protective layer 370, in accordance with some embodiments. The connectors 600 are electrically connected to the TSVs 320. The connectors 600 may be referred to as controlled collapse chip connection (C4) bumps.

In some embodiments, each of the connectors 600 includes an UBM layer 610, a conductive bump 620, a conductive cap layer 630, and a solder layer 640. Some features of the connectors 600 can be replaced or eliminated for different embodiments.

In some embodiments, the UBM layer 610 is in electrical contact with the TSVs 320. The UBM layer 610 may be made of titanium, titanium nitride, tantalum, tantalum nitride, tungsten, titanium tungsten, nickel, gold, chrome, copper, copper alloy, another suitable material, or a combination thereof. In some embodiments, the conductive bump 620 is positioned over the UBM layer 610. The conductive bump 620 may be made of copper, a copper alloy, or another suitable material. In some embodiments, the conductive cap layer 630 is positioned over the conductive bump 620. In some embodiments, the conductive cap layer 630 is made of nickel, tin, SnPb, gold, silver, palladium, indium, NiPdAu, NiAu, another suitable material, or a combination thereof. In some embodiments, the solder layer 640 is positioned over the conductive cap layer 630. In some embodiments, the solder layer 640 is made of Sn, SnAg, SnPb, SnAgCu, SnAgZn, SnZn, SnBiIn, SnIn, SnAu, SnPb, SnCu, SnZnIn, or SnAgSb, another suitable material, or a combination thereof.

Afterwards, the carrier substrate 390 is removed. Suitable light may be provided to detach the adhesive layer and lift off the carrier substrate 390. In some embodiments, the thermal annealing treatment 530 is performed before the removal of the carrier substrate 390. The integrated circuit die 100 and the package component 300 are held by the rigid carrier substrate 390. As a result, the integrated circuit die 100 and the package component 300 are prevented from bending and/or warping due to the thermal annealing treatment 530. Since the thermal annealing treatment 530 is performed after the integrated circuit die 100 and the package component 300 are supported by the carrier substrate 390, it is advantageous for the integrated circuit die 100 to be easily attached to the carrier substrate 390.

Figure 1H:
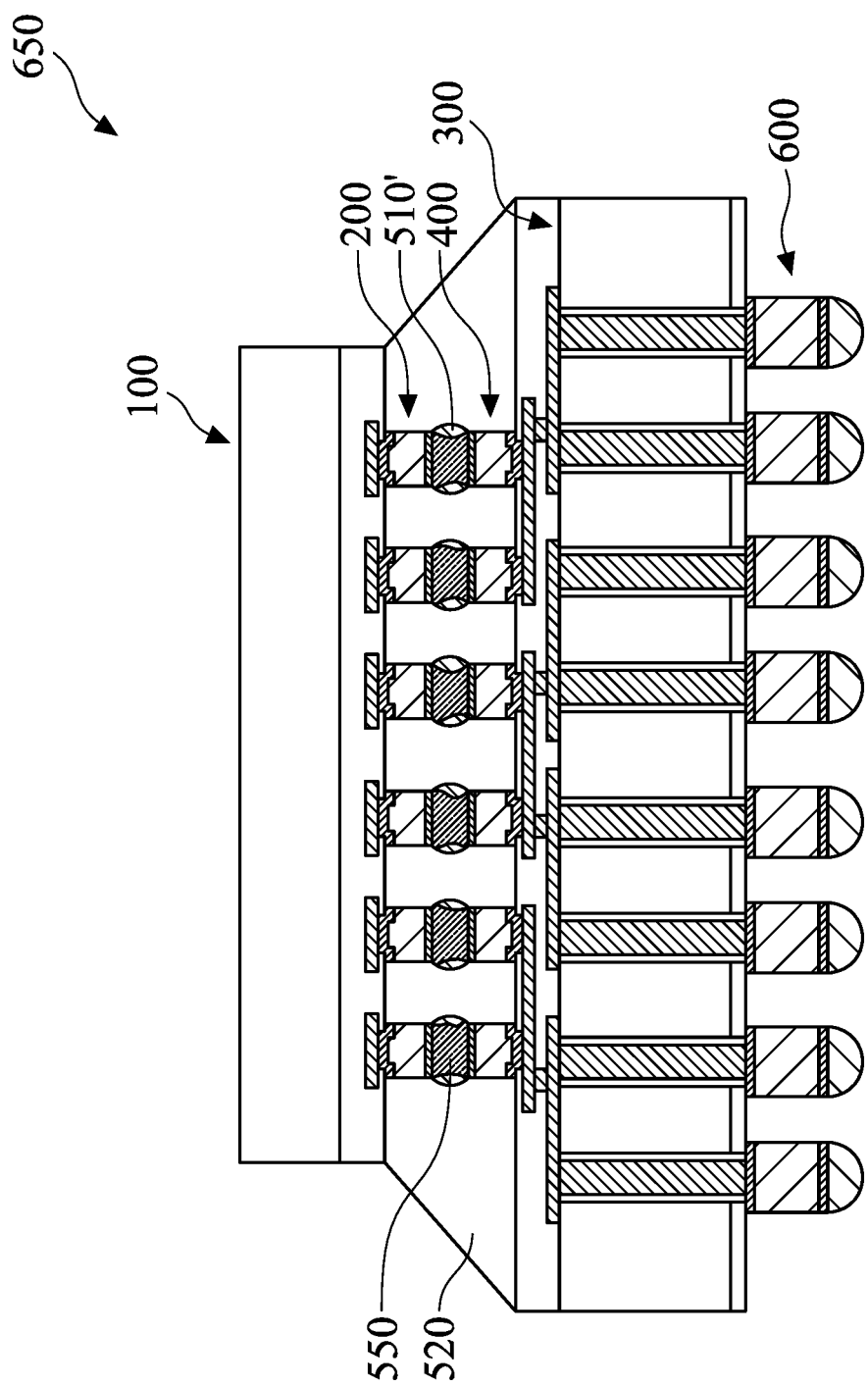

Subsequently, a singulation process is performed to separate the wafer-level package component 300 into multiple die-level sub-package structures 650, in accordance with some embodiments. One of the sub-package structures 650 is shown in FIG. 1H. In some embodiments, the singulation process is a dicing process. The substrate 310, the passivation layer 350, and the protective layer 370 are diced to form the sub-package structures 650. Each of the sub-package structures 650 includes one or more integrated circuit dies, such as the integrated circuit die 100.

Figure 1I:
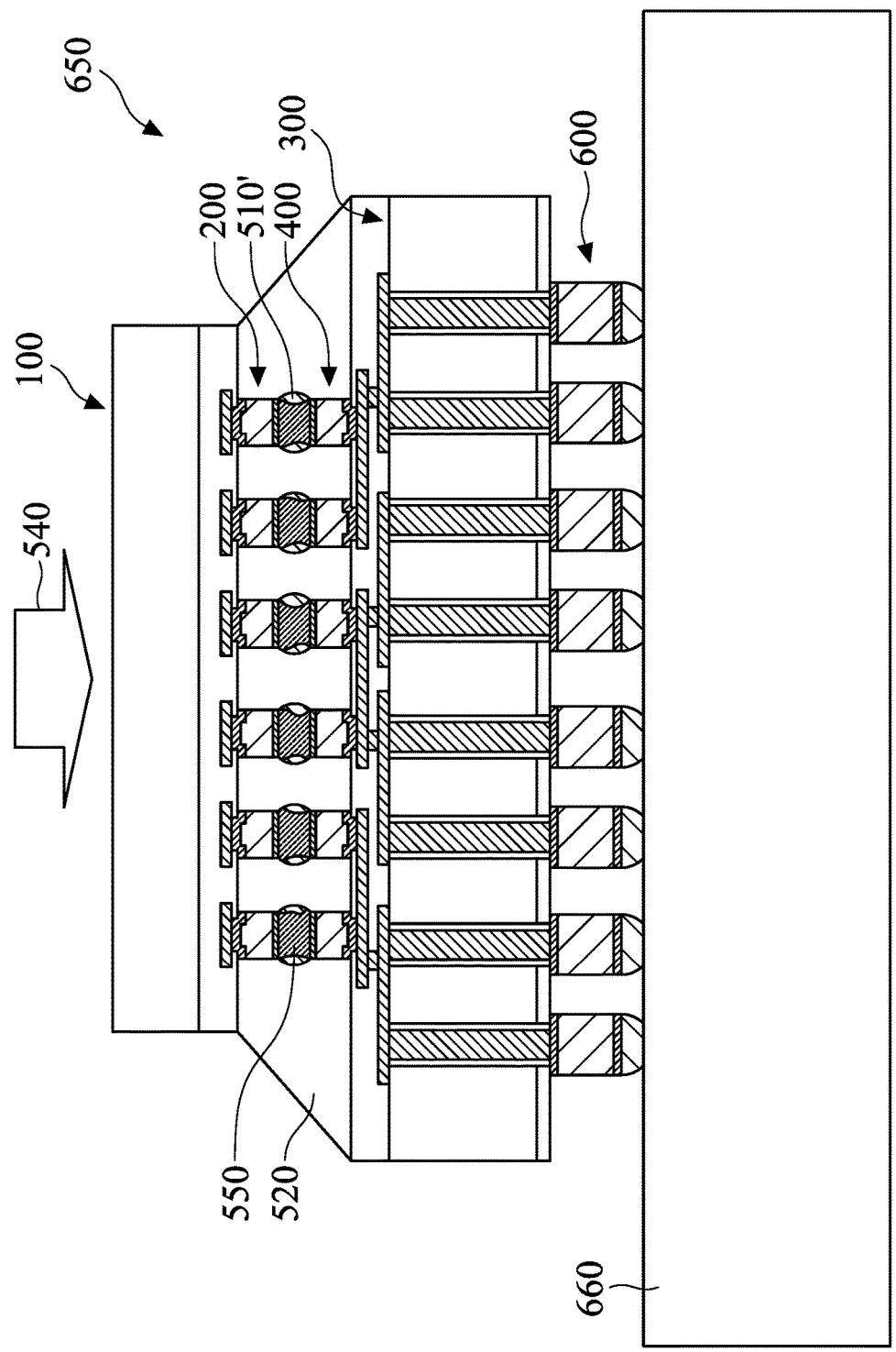

As shown in FIG. 1I, the sub-package structures 650 are bonded to a package substrate 660 through the connectors 600, in accordance with some embodiments. In some embodiments, the package substrate 660 is a printed circuit board (PCB), a ceramic substrate or another suitable package substrate.

In some embodiments, a reflow process 540 is performed to bond the sub-package structures 650 and the package substrate 660 together. In some embodiments, the reflow process is performed at a melting point temperature of the solder layer 640. In some embodiments, the reflow process is performed at a temperature in a range from about 150 degrees C. to about 300 degrees C. However, embodiments of the disclosure are not limited thereto.

In some embodiments, the IMC 550 is broadened during the reflow process 540. In some embodiments, the remaining solder portion 510' is consumed during the reflow process 540. The solder portion 510' may be substantially eliminated after the reflow process 540.

Figure 1J:
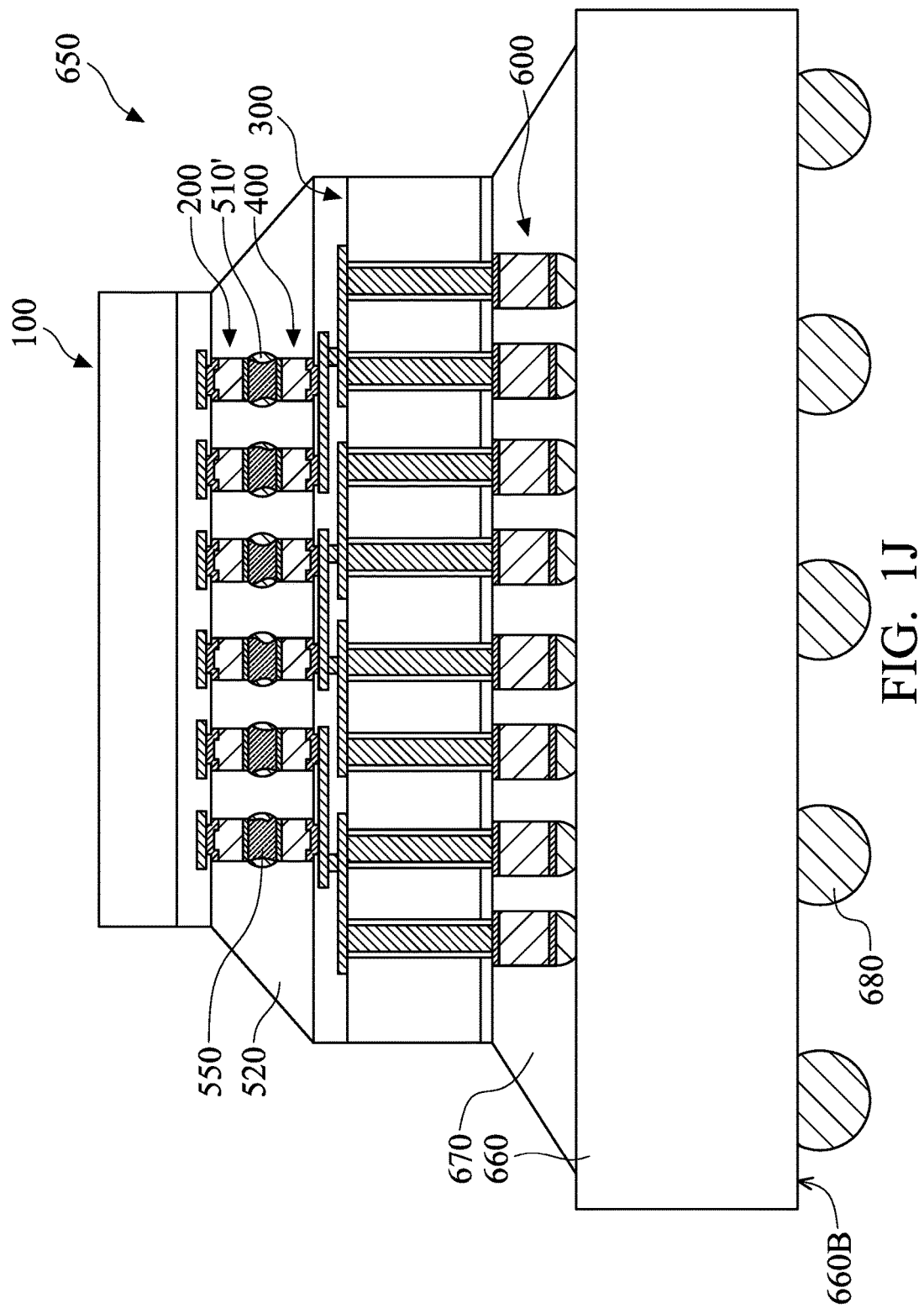

As shown in FIG. 1J, an underfill layer 670 is deposited between the sub-package structures 650 and the package substrate 660, in accordance with some embodiments. As a result, the connectors 600 are embedded in and protected by the underfill layer 670. In some embodiments, the underfill layer 670 includes liquid epoxy, deformable gel, silicon rubber, another suitable material, or a combination thereof. In some embodiments, the underfill layer 670 includes an epoxy-based resin with fillers dispersed therein. The fillers may include insulating fibers, insulating particles, other suitable elements, or a combination thereof. In some embodiments, a dispensing process is performed to form the underfill layer 670.

As shown in FIG. 1J, multiple connectors 680 are formed on the bottom surface 660B of the package substrate 660, in accordance with some embodiments. The connectors 680 are electrically connected to the package substrate 660 and the sub-package structures 650. The connectors 680 may be referred to as bonding bumps or balls. In some embodiments, the connectors 680 include solder or another suitable material. In some embodiments, the size of the connectors 400 is less than that of the connectors 680 and is greater than that of the connectors 200.

Figure 1K:
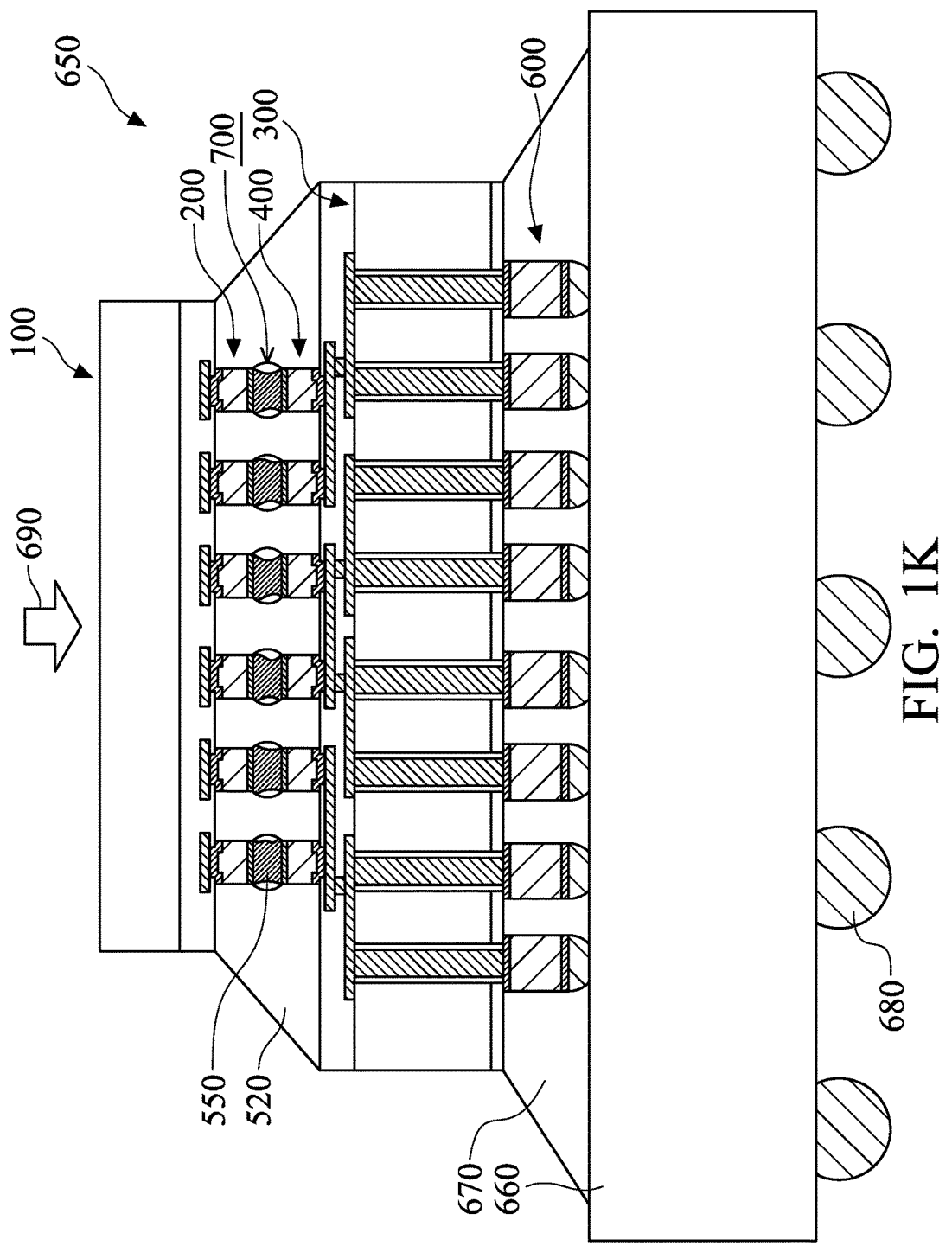

Afterwards, a test 690 is performed, as shown in FIG. 1K in accordance with some embodiments. In some embodiments, one or more additional processes are performed over the package substrate 660 after the steps described in FIG. 1J and before the test 690 shown in FIG. 1K to continue the fabrication of the package structure.

The test 690 may be referred to as a qualification test. In some embodiments, the test 690 is a high-temperature storage (HTS) test, a temperature cycling test (TCT), or another suitable qualification test. The HTS test may be complied with JEDEC (Joint Electron Device Engineering Council) standards. In some embodiments, the test 690 is performed at about 150 degrees C., but embodiments of the disclosure are not limited thereto. In some embodiments, the operation time of the test 690 is in a range from about 1000 hours to about 1500 hours. For example, the operation time of the test 690 may be about 1500 hours. However, embodiments of the disclosure are not limited thereto.

As mentioned above, in some embodiments, the solder joint 510 has one or more remaining solder portions 510' around the IMC 550. The material (such as Sn) of the solder portion 510' may migrate during the test 690 while the IMC 550 does not migrate. For example, the material of the solder portion 510' may migrate to the conductive bump 220 and/or the conductive bump 420. As a result, there may be one or more vacant regions 700 formed around the IMC 550, as shown in FIG. 1K. In some embodiments, the vacant regions 700 are between the IMC 550 and the underfill layer 520.

However, embodiments of the disclosure are not limited thereto. In some other embodiments, the solder portion 510' is partially left so that no vacant region or void is formed between the IMC 550 and the underfill layer 520. In some other embodiments, the solder joint 510 or the solder portion 510' is consumed and substantially eliminated before the test 690. As a result, no vacant region or void is formed between the IMC 550 and the underfill layer 520 and between the connectors 200 and the connectors 400. The vacant regions 700 may be formed before the test 690.

According to some embodiments of the disclosure, the thermal annealing treatment 530 is performed until the IMC 250 and the IMC 450 become connected to each other and form the continuous IMC 550. The solder joint 510 is shrunk during the thermal annealing treatment 530. As a result, there is only few solder remaining between the connectors 200 and the connectors 400. The connectors 200 and the connectors 400 are electrically coupled to each other through the IMC 550, rather than the few solder. Accordingly, even if the remaining solder portion 510' migrates during the test 690, the vacant regions 700 induced by the migration of the solder portion 510' are quite small. The IMC 550 maintains a good electrical bridge between the connectors 200 and the connectors 400. Therefore, electrical circuitry problems caused by voids between the connectors 200 and the connectors 400 are mitigated or prevented. The electrical circuitry problems may include short circuiting, undesirable high resistance, and/or other defects and failures.

According to some other embodiments of the disclosure, the thermal annealing treatment 530 is performed to directly bridge the connectors 200 and the connectors 400 through the IMC 550. The solder joint 510 is substantially eliminated during the thermal annealing treatment 530. As a result, there is no solder joint between the connectors 200 and the connectors 400 so that no solder material migrates or flows during the test 690. Accordingly, there is substantially no void between the connectors 200 and the connectors 400. Electrical circuitry problems due to disconnection or insufficient connection between the connectors 200 and the connectors 400 are eliminated. Therefore, the reliability and lifetime of the package structure are enhanced significantly.

Many variations and/or modifications can be made to embodiments of the disclosure. The thermal annealing treatment 530 is not limited to be performed after the steps described in FIG. 1E and before the steps described in FIG. 1G.

Figure 2A:
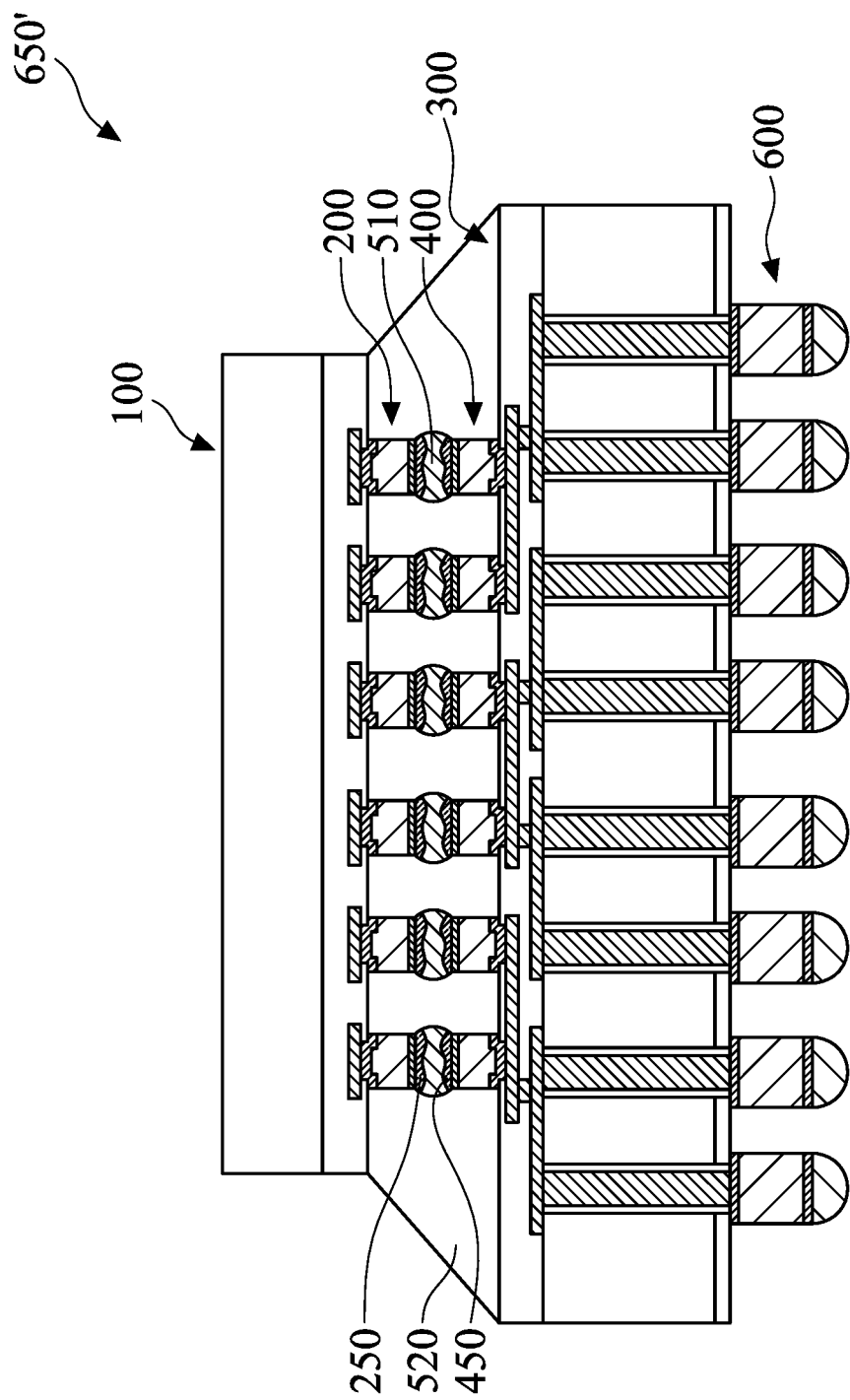
FIGS. 2A-2C are cross-sectional views of various stages of a process for forming a package structure, in accordance with some embodiments.
Figure 2B:
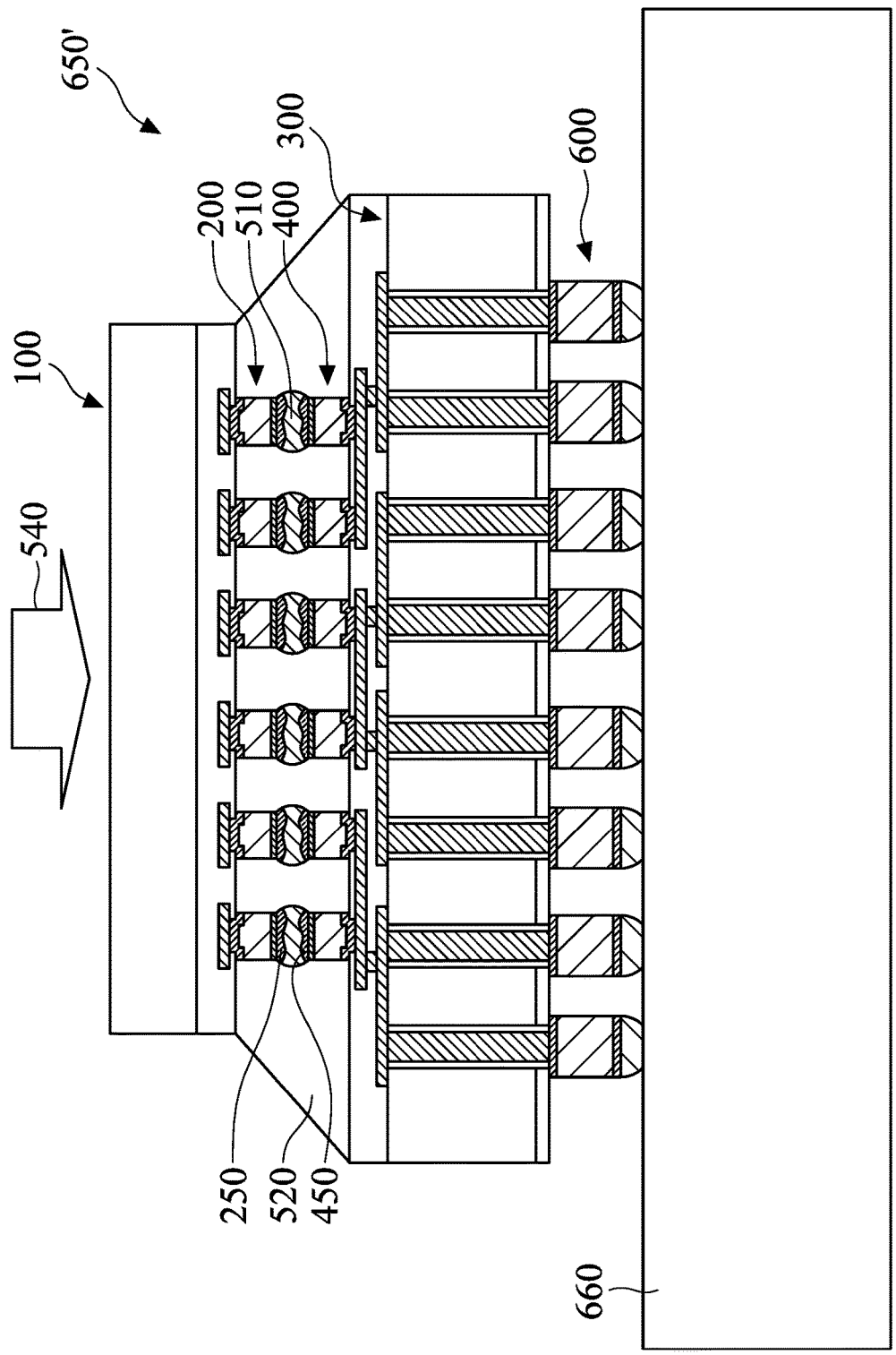
Figure 2C:
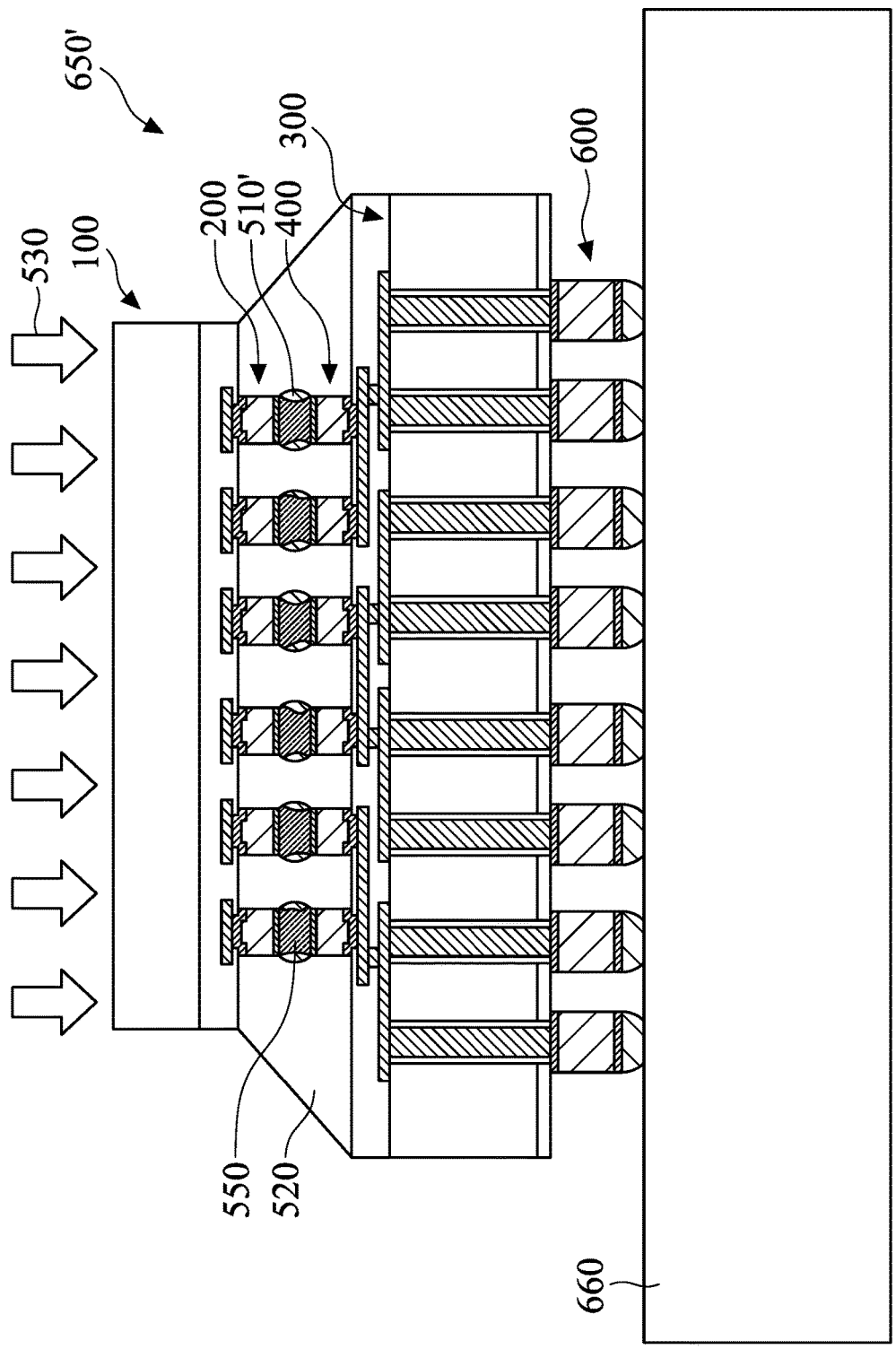

FIGS. 2A-2C are cross-sectional views of various stages of a process for forming a package structure, in accordance with some embodiments. As shown in FIG. 2A, a sub-package structure 650' is provided. The materials and/or formation methods of the sub-package structure 650' are the same as or similar to those of the sub-package structures 650, as illustrated in the aforementioned embodiments, and are not repeated.

As shown in FIGS. 1H and 2A, the structure of the sub-package structure 650' is similar to that of the sub-package structures 650. In some embodiments, the thermal annealing treatment 530 is not performed during the formation of the sub-package structure 650'. As a result, the IMC 250 and the IMC 450 of the sub-package structure 650' are not connected to each other and separated by the solder joint 510, as shown in FIG. 2A. In some embodiments, the thickness of the IMC 250 or the IMC 450 is less than the distance between one of the connectors 200 and one of the connectors 400. There is no continuous IMC between one of the connectors 200 and one of the connectors 400.

As shown in FIG. 2B, the steps described in FIG. 1I are performed over the structure shown in FIG. 2A, in accordance with some embodiments. As a result, the sub-package structure 650' is bonded to the package substrate 660 through the connectors 600. In some embodiments, a reflow process 540 is performed to bond the sub-package structure 650' and the package substrate 660 together. In some embodiments, the IMC 250 and the IMC 450 are slightly broadened during the reflow process 540. In some embodiments, the IMC 250 and the IMC 450 keep separated from each other by the solder joint 510 after the sub-package structure 650' is bonded to the package substrate 660. There is no IMC continuously extending from one of the connectors 200 to one of the connectors 400 after the reflow process 540.

As shown in FIG. 2C, a thermal annealing treatment 530 is performed over the package substrate 660, in accordance with some embodiments. In some embodiments, the materials of the solder joint 510 and the conductive bump 220 migrate and react with each other during the thermal annealing treatment 530. In some embodiments, the materials of the solder joint 510 and the conductive bump 420 migrate and react with each other during the thermal annealing treatment 530. As a result, the IMC 250 and the IMC 450 are enlarged while the solder joint 510 becomes smaller.

In some embodiments, the IMC 250 and the IMC 450 are thickened and broadened until the IMC 250 and the IMC 450 become connected to form a durable IMC 550. The IMC 550 constructs a sufficiently strong and firm connection between the connectors 200 and the connectors 400.

In some embodiments, the solder joint 510 between the IMC 250 and the IMC 450 is reacted and consumed during the thermal annealing treatment 530. In some embodiments, the solder joint 510 has one or more remaining solder portions 510' adjoining the IMC 550. However, embodiments of the disclosure are not limited thereto. In some other embodiments, the solder joint 510 is substantially eliminated after the thermal annealing treatment 530.

Subsequently, the steps described in FIGS. 1J and 1K are performed over the structure shown in FIG. 2C to continue the fabrication of the package structure, in accordance with some embodiments. In some embodiments, the package structure including the sub-package structure 650' has good performance in a qualification test, such as an HTS test. There may be substantially no void formed between the connectors 200 and the connectors 400 during the qualification test. The IMC 550 provides good physical and electrical connections between the connectors 200 and the connectors 400 after the package structure has suffered from high temperatures for a long time in the qualification test. Accordingly, the lifetime of the package structure is extended as a result of the thermal annealing treatment 530.

Many variations and/or modifications can be made to embodiments of the disclosure. In accordance with some embodiments, the thermal annealing treatment 530 is performed to link the connectors 200 and the connectors 400 at any suitable step before the test 690. In some embodiments, the thermal annealing treatment 530 is performed one or more times at suitable steps before the test 690 to meet requirements. For example, multiple thermal annealing treatments 530 are performed over the structures shown in FIGS. 1F and 1J before the test 690.

Many variations and/or modifications can be made to embodiments of the disclosure. For example, although the embodiments shown in FIGS. 1A-1K and 2A-2C provide a CoWoS package structure, embodiments of the disclosure are not limited thereto. Embodiments of the disclosure can be applied to fabrication processes for any suitable package structure including connectors jointed together.

Embodiments of the disclosure provide a package structure and methods for forming the same. The package structure includes an integrated circuit die having a first connector. The package structure also includes a package component having a second connector. The integrated circuit die and the package component are bonded together through a solder joint between the first and second connectors. There are two IMCs formed between the first and second connectors. The IMCs are separated by the solder joint. A thermal annealing treatment is performed before a qualification test is performed over the package structure. The solder joint reacts with the material of the first and second connectors so that more intermetallic compounds are formed. The solder joint is consumed during the thermal annealing treatment. As a result, the two separated IMCs become connected to each other so that a continuous IMC is formed between the first and second connectors. The continuous IMC provides good physical and electrical connections between the first and second connectors. There may be substantially no void between the first and second connectors. Accordingly, short circuiting, undesirable high resistance, and/or other defects and failures are prevented. Therefore, embodiments of the disclosure provide a more reliable and durable package structure.

In accordance with some embodiments, a package structure is provided. The package structure includes a package component comprising a first bump. The package structure also includes an IMC on the first bump. The package structure further includes an integrated circuit die comprising a second bump on the IMC. The integrated circuit die and the package component are bonded together through the first bump and the second bump. The IMC extends from the first bump to the second bump to electrically connect to the first bump and the second bump.

In accordance with some embodiments, a package structure is provided. The package structure includes a first bump. The package structure also includes an IMC on the first bump. The package structure further includes an integrated circuit die comprising a second bump on the IMC. In addition, the package structure includes an underfill layer surrounding the first bump, the IMC and the second bump. The IMC adjoins the first bump, the second bump and the underfill layer.

In accordance with some embodiments, a method for forming a package structure is provided. The method includes forming a first bump over a substrate. The method also includes placing an integrated circuit die comprising a second bump over the substrate. The second bump is placed on the first bump. The method further includes reflowing the first bump and the second bump to form a solder joint and bond the integrated circuit die and the substrate together through the solder joint. A first IMC is formed between the solder joint and the first bump. A second IMC is formed between the solder joint and the second bump. In addition, the method includes annealing the solder joint, the first bump and the second bump to react the solder joint with the first bump and the second bump until the first IMC and the second IMC become connected to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a first bump over a substrate;
    placing an integrated circuit die comprising a second bump over the substrate, wherein the second bump is placed on the first bump;
    reflowing the first bump and the second bump to form a solder joint and bond the integrated circuit die and the substrate together through the solder joint, wherein a first intermetallic compound is formed between the solder joint and the first bump, and a second intermetallic compound is formed between the solder joint and the second bump;
    annealing the solder joint, the first bump and the second bump to react the solder joint with the first bump and the second bump until the first intermetallic compound and the second intermetallic compound become connected to each other; and
    migrating a remaining portion of the solder joint to the first bump or the second bump during a high-temperature storage test or a temperature cycling test.

2. The method for forming a package structure as claimed in claim 1, wherein the annealing is performed at a melting point temperature of the solder joint.

3. The method for forming a package structure as claimed in claim 1, wherein the solder joint is shrunk during the annealing and is substantially eliminated after the annealing.

4. The method for forming a package structure as claimed in claim 1, further comprising forming an underfill layer surrounding the solder joint, the first bump and the second bump before the annealing.

5. The method for forming a package structure as claimed in claim 1, further comprising testing the package structure after the first intermetallic compound and the second intermetallic compound become connected to each other.

6. The method for forming a package structure as claimed in claim 1, further comprising:
    forming a conductive feature embedded in the substrate before the formation of the first bump, wherein the conductive feature extends from a first surface of the substrate towards a second surface of the substrate that is opposite to the first surface;
    attaching the integrated circuit die to a carrier substrate after the reflowing; and
    thinning the substrate from the second surface until the conductive feature is exposed to form a through-substrate via in the substrate, wherein the annealing is performed after the thinning.

7. The method for forming a package structure as claimed in claim 6, further comprising:
    forming a third bump over the second surface of the substrate after the annealing, wherein the third bump is electrically connected to the through-substrate via; and
    removing the carrier substrate after the formation of the third bump.

8. The method for forming a package structure as claimed in claim 1, further comprising:
    forming a through-substrate via in the substrate, wherein the through-substrate via is electrically connected to the first bump over a first surface of the substrate;
    forming a third bump over a second surface of the substrate that is opposite to the first surface, wherein the third bump is electrically connected to the through-substrate via; and
    dicing the substrate to form a sub-package structure, wherein the annealing is performed before the dicing of the substrate.

9. The method for forming a package structure as claimed in claim 8, further comprising bonding the sub-package structure to a package substrate through the third bump, wherein the annealing is performed over the package substrate before the bonding.

10. A method for forming a package structure, comprising:
   forming a first bump over a substrate;
   placing a second bump over the first bump, wherein the second bump is formed over an integrated circuit die;
   reflowing the first bump and the second bump to bond the integrated circuit die and the substrate together through a solder joint, wherein a first intermetallic compound is formed between the solder joint and the first bump, and a second intermetallic compound is formed between the solder joint and the second bump;
   forming a first underfill layer surrounding the solder joint;
   annealing the solder joint, the first bump and the second bump, so that a continuous intermetallic compound is formed from the first intermetallic compound and the second intermetallic compound; and
   migrating a remaining solder portion of the solder joint to form a vacant region between the continuous intermetallic compound and the first underfill layer.

11. The method for forming a package structure as claimed in claim 10, wherein a thickness of the continuous intermetallic compound is substantially equal to a distance between the first bump and the second bump.

12. The method for forming a package structure as claimed in claim 10, wherein the solder joint surrounds the continuous intermetallic compound after the annealing.

13. The method for forming a package structure as claimed in claim 10, wherein the continuous intermetallic compound is an alloy comprising tin and a metal different from tin.

14. The method for forming a package structure as claimed in claim 10, further comprising:
   forming a through-substrate via in the substrate, wherein the through-substrate via is electrically connected to the first bump over a first surface of the substrate;
   forming a third bump over a second surface of the substrate that is opposite to the first surface, wherein the third bump is electrically connected to the through-substrate via;
   dicing the substrate to form a sub-package structure; and
   reflowing the third bump to bond the sub-package structure and a package substrate together.

15. The method for forming a package structure as claimed in claim 14, further comprising:
   forming a second underfill layer surrounding the third bump after the annealing, and
   wherein the first underfill layer surrounds the first bump and the second bump before the annealing.

16. The method for forming a package structure as claimed in claim 14, further comprising forming a fourth bump on a bottom surface of the package substrate, wherein a size of the first bump is less than that of the fourth bump.

17. A method for forming a package structure, comprising:
   forming a first conductive pillar over a substrate and a first solder layer over the first conductive pillar;
   forming a second conductive pillar over an integrated circuit die and a second solder layer over the second conductive pillar;
   attaching the first solder layer with the second solder layer;
   reflowing the first conductive pillar, the second conductive pillar, the first solder layer and the second solder layer to form a first intermetallic compound, a second intermetallic compound, and a solder joint between the first intermetallic compound and the second intermetallic compound;
   forming an underfill layer surrounding the solder joint, the first bump and the second bump;
   annealing the first conductive pillar, the second conductive pillar, the solder joint, the first intermetallic compound and the second intermetallic compound until the first intermetallic compound and the second intermetallic compound become connected to form a continuous intermetallic compound after the underfill layer is formed, wherein the first solder layer and the second solder layer become a remaining solder portion surrounding the continuous intermetallic compound after the annealing; and
   testing the package structure after the continuous intermetallic compound is formed, wherein the remaining solder portion migrates to the first conductive pillar and the second conductive pillar to form a vacant region surrounding the continuous intermetallic compound after testing.

18. The method for forming a package structure as claimed in claim 17, further comprising:
   forming a first cap layer between the first conductive pillar and the first solder layer; and
   forming a second cap layer between the second conductive pillar and the second solder layer, wherein the continuous intermetallic compound has a thickness greater than that of the first cap layer and the second cap layer.

19. The method for forming a package structure as claimed in claim 17, further comprising:
   migrating the solder joint to the first bump or the second bump to form a vacant region surrounding the continuous intermetallic compound.

20. The method for forming a package structure as claimed in claim 17, wherein the testing is a high-temperature storage test or a temperature cycling test.

* * * * *